(12) United States Patent
Becker et al.

(10) Patent No.: US 6,794,902 B2
(45) Date of Patent: Sep. 21, 2004

(54) VIRTUAL GROUND CIRCUIT

(75) Inventors: Matthew E. Becker, Montgomery, AL (US); Harry R. Fair, III, Arlington, MA (US); Marc E. Lamere, Carlisle, MA (US); Jonathan A. White, Boxborough, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/172,574

(22) Filed: Jun. 14, 2002

(65) Prior Publication Data

US 2003/0231030 A1 Dec. 18, 2003

(51) Int. Cl.[7] ........................ H03K 19/096; H03K 19/20
(52) U.S. Cl. ................................. 326/95; 326/114
(58) Field of Search .............................. 326/83, 93, 95, 326/98, 114

(56) References Cited

U.S. PATENT DOCUMENTS 6,366,134 B1 * 4/2002 Deng ........................ 326/121

* cited by examiner

*Primary Examiner*—Daniel D. Chang
(74) *Attorney, Agent, or Firm*—Lahive & Cockfield, LLP; Kevin J. Canning

(57) ABSTRACT

Methods and systems for improving a logic circuit are described. By using a voltage reducer for connecting a power-supply to a virtual ground, the voltage reducer reduces the voltage supplied by the power-supply to the virtual ground during one phase of the clock, thereby increasing the speed and efficiency of the logic circuit.

22 Claims, 4 Drawing Sheets

VIRTUAL GROUND CIRCUIT

TECHNICAL FIELD

The present invention relates generally to logic circuits, and specifically relates to logic circuits having a virtual ground.

BACKGROUND OF THE INVENTION

A virtual ground circuit can be used to help the speed and power of a gate in dynamic circuits. In particular, replacing a clocked footer conventionally found at the bottom of an n-device stack in such circuits with a shared virtual ground saves power and increases performance.

SUMMARY OF THE INVENTION

Described herein is a system and method that utilizes three virtual ground pre-charge systems to improve the dynamic node charge time of a logical circuit. In particular, a logic circuit synchronized by a clock having an A (high) and a B (low) phase is described. The logic circuit includes a wired-OR device receiving a wired-OR voltage during the B phase of the clock, and a virtual ground connected to the wired-OR device via a digital network. The logic circuit also includes a voltage reducer for connecting a power-supply, supplying a power-supply voltage, to the virtual ground. The voltage reducer reduces the power-supply voltage supplied by the power-supply to the virtual ground during the B phase of the clock, and reduces the charge on the virtual ground, thereby increasing the speed and efficiency of the logic circuit.

Also described herein is a method for increasing the speed and efficiency of a logic circuit synchronized by a clock having an A and a B phase. The method includes providing a wired-OR device that, during the B phase of the clock, receives a wired-OR voltage. The method also includes connecting a virtual ground to the wired-OR device via a digital network, and, during the B phase of the clock, supplying a first power-supply voltage from a first power-supply to the virtual ground via a voltage reducer. The voltage reducer reduces the first power-supply voltage supplied by the first power-supply to the virtual ground, and reduces the charge on the virtual ground, thereby increasing the speed and efficiency of the logic circuit.

DETAILED DESCRIPTION OF THE INVENTION

Figure 1:
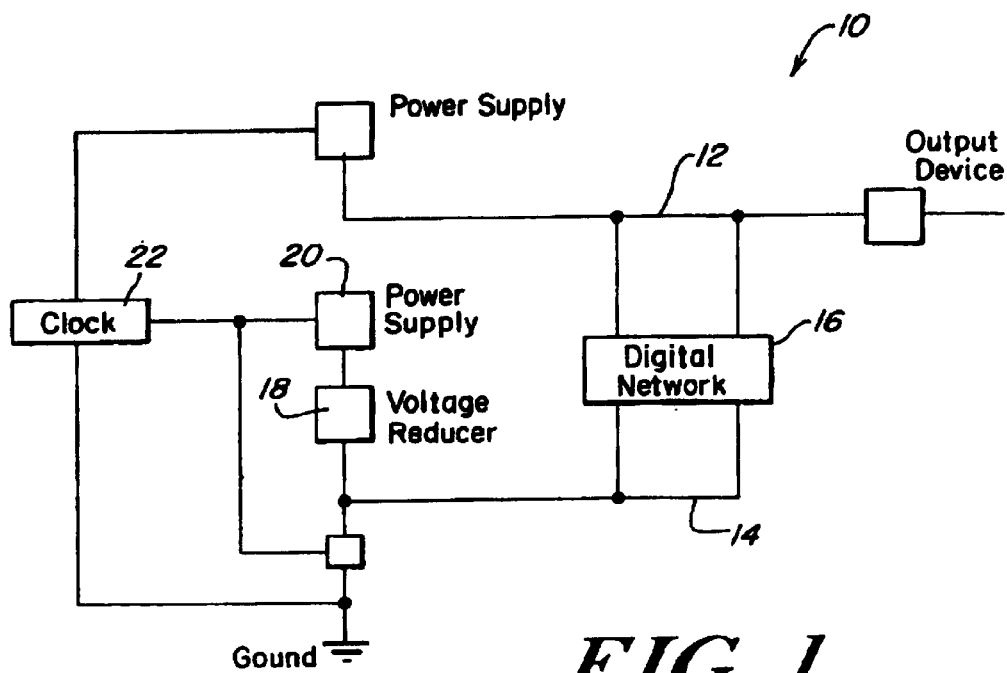
FIG. 1 is a schematic block diagram of a logic circuit 10, according to the teachings of the present invention.

Described herein is a system and method that utilizes a virtual ground pre-charge system to improve the dynamic node charge times of a logical circuit. A voltage reducer reduces the voltage on a virtual ground during the B phase of a clock without undermining the performance and power gains of the virtual ground circuit.

FIGS. 1 through 4, wherein like parts are designated by like reference numerals throughout, illustrate an example embodiment of a system and method suitable for virtual ground circuits. Although the present invention is described with reference to the example embodiments illustrated in the figures, it should be understood that many alternative forms could embody the present invention. One of ordinary skill in the art will additionally appreciate different ways to alter the parameters of the embodiments disclosed, such as the size, language, interface, or type of elements or materials utilized, in a manner still in keeping with the spirit and scope of the present invention.

Referring to FIG. 1, a block diagram of a logic circuit 10 is shown. The logic circuit 10 includes a wired-OR device 12, and a virtual ground 14 connected to the wired-OR device 12 via a digital network 16. The logic circuit 10 further includes a voltage reducer 18 for connecting a first power supply 20 to the virtual ground 14. A clock 22 having an A and a B phase synchronizes the logic circuit 16.

The wired-OR device 12 receives a wired-OR voltage during the B phase of the clock 22. The voltage reducer 18 connects the first power supply 20, supplying a first power supply voltage, $V_{DD}$, to the virtual ground 14. The voltage reducer 18 reduces the first power supply voltage supplied by the first power supply 20 to the virtual ground 14 during the B phase of the clock 22, and reduces the charge on the virtual ground, thereby increasing the speed and efficiency of the logic circuit 10.

Figure 2:
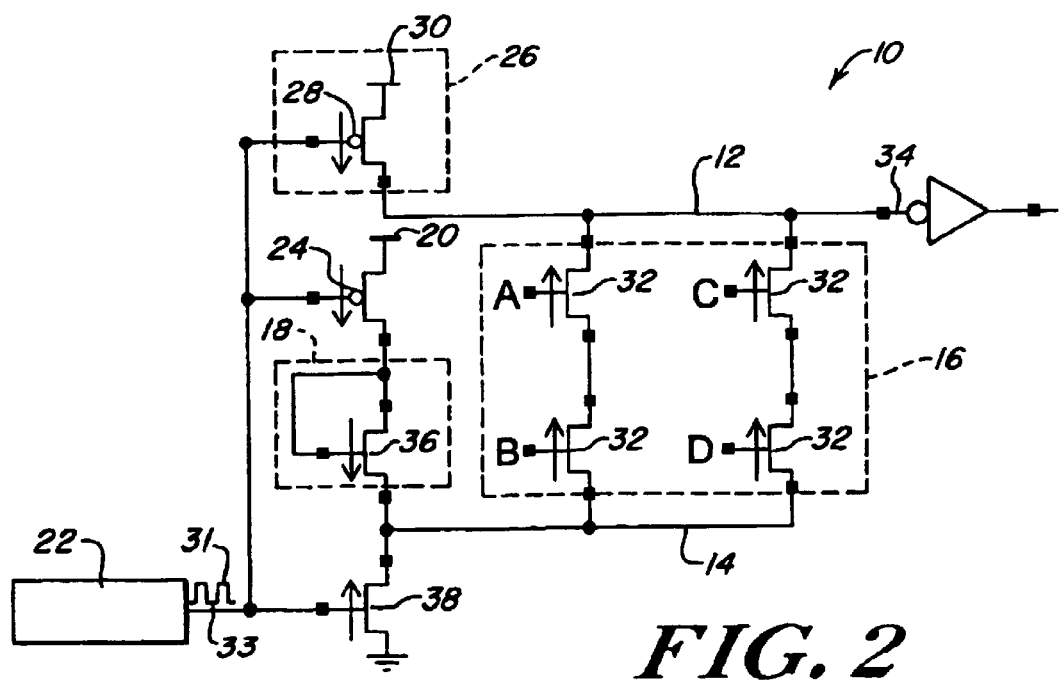
FIG. 2 presents more details in one embodiment of the logic circuit 10 shown in FIG. 1, according to the teachings of the present invention.

Referring to FIG. 2, one embodiment of the logic circuit 10 is shown, according to the teachings of the present invention. The first power supply 20 is connected to the voltage reducer 18 via a first p-channel metal oxide semiconductor (PMOS) device 24. The wired-OR device 12 includes a pre-charge device 26 for supplying the wired-OR voltage. The pre-charge device 26 includes a second PMOS device 28 and a second power supply 30 connected to the source of the second PMOS device 28. The digital network 16 can include at least one transistor with a variable binary input. For example, in FIG. 2 the digital network 16 includes four MOS devices 32 forming two logical AND gates. The wired-OR device 12 includes an output 34 having a binary value that is dependent on the variable binary input of the MOS devices 32 of the digital network 16. In the embodiment of the logic circuit 10 shown in FIG. 2, the voltage reducer 18 includes one MOS device 36. A schematic of the A phase 31 and the B phase 33 of the clock 22 is also shown.

During the B phase of the clock 22, the gate of the PMOS device 28 is open. The second power supply 30 provides a second power supply voltage, which can be $V_{DD}$, to the source of the PMOS device 28. Consequently, the wired-OR device receives a voltage approximately equal to $V_{DD}$ when the clock 22 is in the B phase, corresponding to when the gate of the PMOS device 28 is open. The first power supply 20 is connected to the virtual ground 14 via the voltage reducer 18. The first power supply 20 applies a first power supply voltage, $V_{DD}$, to the source of the PMOS device 24. During the B phase of the clock, the gate of the PMOS device 24 is open supplying a voltage substantially equal to the first power supply voltage, to the voltage reducer 18. In this example, the first power supply voltage can be approximately equal to the second power supply voltage.

As the current travels through the voltage reducer 18 during the B phase of the clock, on its way to the virtual ground 14, the voltage reducer 18 reduces the voltage supplied to the virtual ground 14 by an amount that is approximately equal to the threshold voltage, $V_T$, of the NMOS device 36. Therefore, during the B phase of the clock, the virtual ground 14, instead of being at a voltage equal to approximately $V_{DD}$, is instead equal to a voltage approximately equal to $V_{DD}$-$V_T$.

During the A phase of the clock 22, the gate of the NMOS device 38 is open. Because this NMOS device 38 has a source that is grounded, during the A phase of the clock 22, the virtual ground 14 diminishes in voltage to ground. Because this change in voltage of the virtual ground 14 is from $V_{DD}$-$V_T$ to ground, instead of $V_{DD}$ to ground, the speed and efficiency of the logic circuit 10 is improved. In particular, by reducing the voltage on the virtual ground, the charge is also reduced. Therefore, less power is consumed by the virtual ground. Also, since the voltage on the virtual ground is reduced, the virtual ground can be discharged faster because there is less charge to move off of the virtual ground. The overall speed of the circuit is therefore improved.

During the B phase of the clock, the input values for the digital network 16 are set. The input values are used to evaluate a binary function of the logic circuit 10. During the A phase of the clock, the binary function is evaluated. The wired-OR device 12 produces an output 34 having a binary value that is dependent on the variable binary input of the gates of the MOS devices 32 of the digital network 16.

Figure 3A:
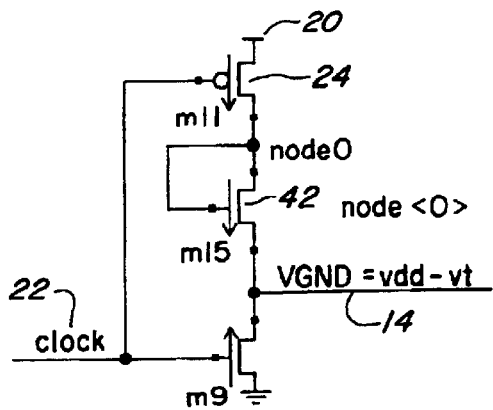
FIGS. 3A–F show several embodiments of the voltage reducer shown in FIG. 2, according to the teachings of the present invention.
Figure 3B:
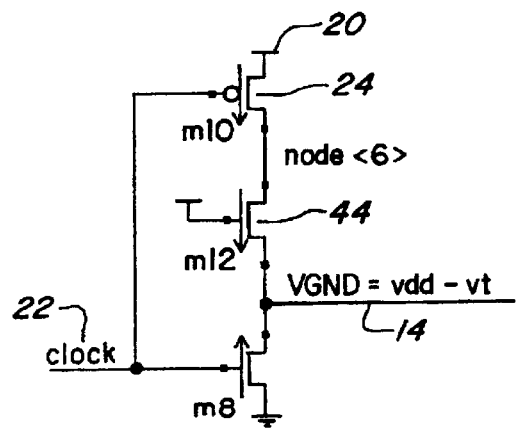

Referring to In FIG. 3A, the voltage reducer 18 includes one NMOS device 42 with its gate connected to its drain at $V_{DD}$, thus maintaining the NMOS device 42 in a conduction state. In FIG. 3B, the voltage reducer 18 includes one NMOS device 44 with its gate attached to a power supply providing a voltage of $V_{DD}$. The power supply maintains the gate of the NMOS device 44 on. Using such voltage reducers 18 as shown in FIGS. 3A and 3B results in the virtual ground 14 having a voltage of $V_{DD}$-$V_T$ during the B phase of the clock 22.

Figure 3C:
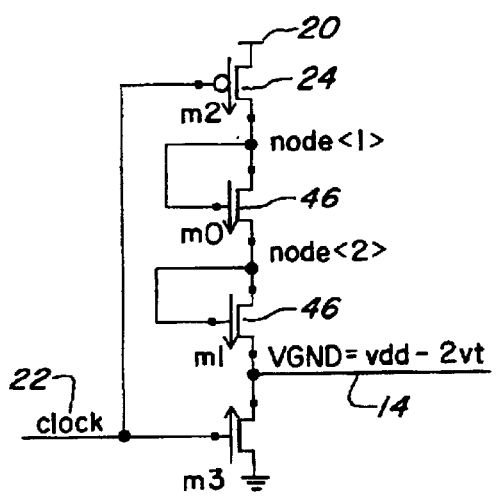
Figure 3D:
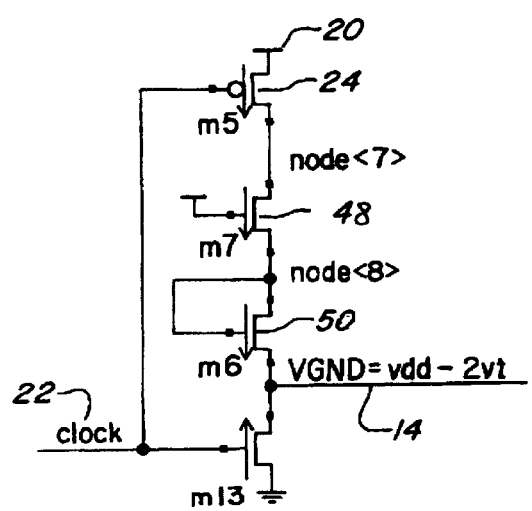

In FIG. 3C, the voltage reducer 18 includes two NMOS devices 46 connected in series. The NMOS devices 46 have their gates connected to their source at $V_{DD}$, thus maintaining the NMOS devices 46 in a conduction state. In FIG. 3D, the voltage reducers 18 includes two NMOS devices 48 and 50. The NMOS device 48 has its gate attached to a power supply providing a voltage of $V_{DD}$. The power supply maintains the gate of the NMOS device 48 open. The NMOS device 50 has its gate connected to its source, thus maintaining the NMOS device 50 in a conduction state. Using such voltage reducers 18 as shown in FIGS. 3C and 3D results in the virtual ground 14 having a voltage of $V_{DD}$-2$V_T$ during the B phase of the clock 22.

Figure 3E:
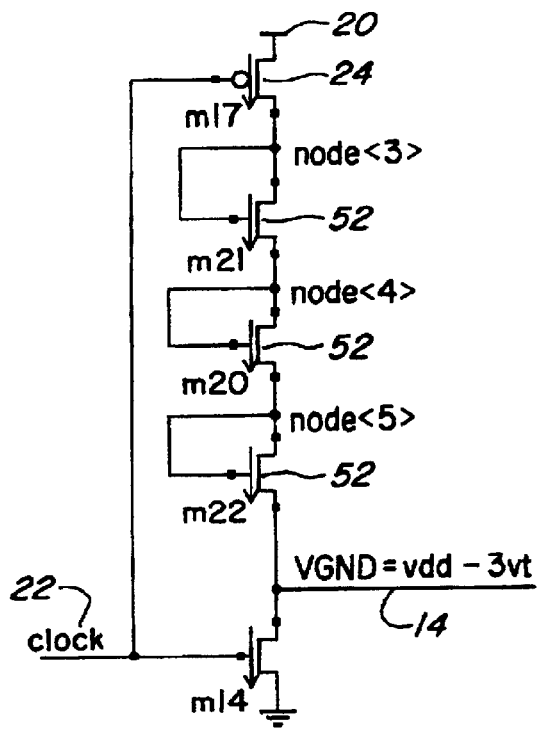
Figure 3F:
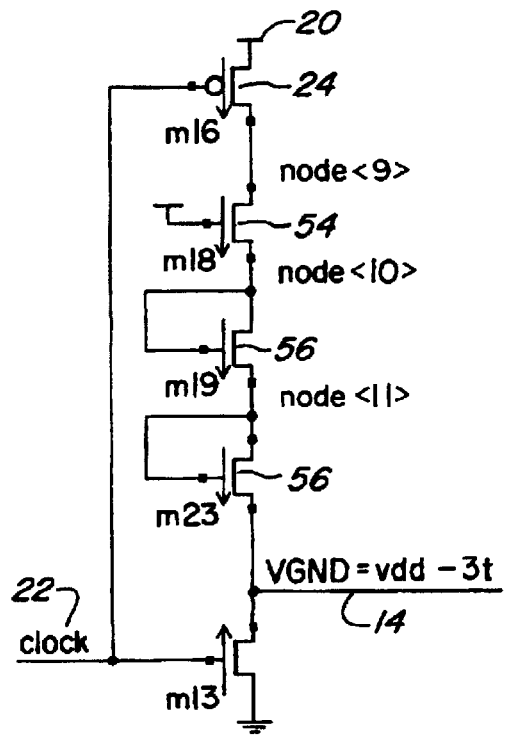

In FIG. 3E, the voltage reducer 18 includes three NMOS devices 52 connected in series. The NMOS devices 52 have their gates connected to their source, thus maintaining the NMOS devices 52 in a conduction state. In FIG. 3F, the voltage reducers 18 includes three NMOS devices. The NMOS device 54 has its gate attached to a power supply providing a voltage of $V_{DD}$. The power supply maintains the gate of the NMOS device 54 on. The NMOS devices 56 have their gates connected to their sources, thus maintaining the NMOS devices 56 in a conduction state. Using such voltage reducers 18 as shown in FIGS. 3E and 3F results in the virtual ground 14 having a voltage of $V_{DD}$-3 $V_T$ during the B phase of the clock 22.

Those of ordinary skill in the art will recognize that other embodiments of the voltage reducer 18 are possible that reduce the voltage of the virtual ground 14 by integer multiples of the threshold voltage $V_T$.

Figure 4:
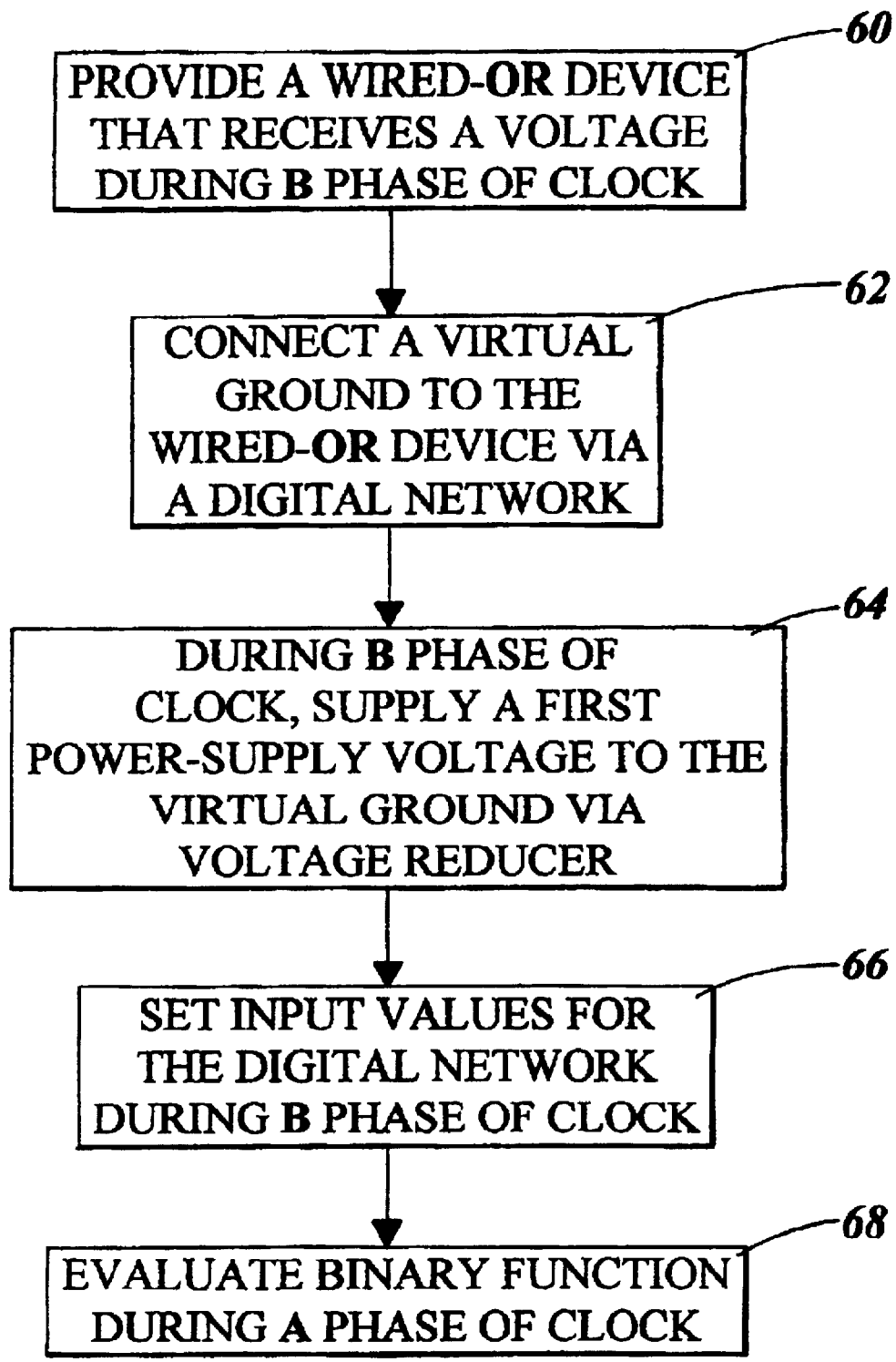
FIG. 4 shows a flowchart for increasing the speed and efficiency of a logic circuit synchronized by a clock having an A and a B phase according to the teachings of the present invention.

FIG. 4 shows a flowchart of the steps that are performed for increasing the speed and efficiency of a logic circuit synchronized by a clock having an A and a B phase in accordance with the techniques of the present invention. In step 60, a wired-OR device 12 is provided that receives a wired-OR voltage during the B phase of the clock. In step 62, a virtual ground 14 is connected to the wired-OR device 12 via a digital network 16. During a B phase of the clock, in step 64, a first power-supply voltage is supplied from the first power-supply 20 to the virtual ground 14 via the voltage reducer 18. The first power-supply 20 can be connected to the voltage reducer 18 via a first p-channel metal-oxide semiconductor (PMOS) device 24. In addition, the first power-supply 20 can supply the first power-supply voltage, $V_{DD}$, to a first source of the first PMOS device.

In step 66, input values are set for the digital network during the B phase of the clock. The input values are used to evaluate a binary function of the logical circuit 10. In step 68, the binary function is evaluated during the A phase of the clock. The wired-OR device 12 includes an output 34 having a binary value that is dependent on the variable binary input of the at least one transistor of the digital network 16.

As described above, the voltage reducer 18 reduces the first power-supply voltage supplied by the first power-supply 20 to the virtual ground 14. In particular, each of the at least one MOS device included in the voltage reducer 18 can reduce the first power-supply voltage supplied by the first power-supply to the virtual ground by a threshold voltage, thereby increasing the speed and efficiency of the logic circuit 10.

Those skilled in the art will recognize, or be able to ascertain using no more than routine experimentation, many equivalents to the specific embodiments and methods described herein. Such equivalents are intended to be encompassed by the scope of the following claims.

What is claimed:

1. A logic circuit synchronized by a clock having an A phase and a B phase, comprising
a wired-OR device receiving a wired-OR voltage during the B phase of the clock;
a virtual ground connected to the wired-OR device via a digital network; and
a voltage reducer for connecting a first power-supply, supplying a first power-supply voltage, to the virtual ground, wherein the voltage reducer reduces the first power-supply voltage supplied by the first power-supply to the virtual ground during the B phase of the clock to a level less than the first power supply voltage and greater than ground, thereby increasing the speed and efficiency of the logic circuit.

2. The logical circuit of claim 1, wherein the first power-supply is connected to the voltage reducer via a first p-channel metal-oxide semiconductor (PMOS) device.

3. The logic circuit of claim 2, wherein the first power-supply supplies the first power-supply voltage, $V_{DD}$, to a first source of the first PMOS device.

4. The logic circuit of claim 3, wherein the wired-OR device includes a pre-charge device for supplying the wired-OR voltage.

5. The logic circuit of claim 4, wherein the pre-charge device includes a second PMOS device.

6. The logic circuit of claim 5, wherein the pre-charge device includes a second power-supply that supplies a second power-supply voltage to a second source of the second PMOS device.

7. The logic circuit of claim 6, wherein the wired-OR voltage and the second power-supply voltage are substantially equal to $V_{DD}$.

8. The logical circuit of claim 7, wherein the digital network includes at least one transistor with a variable binary input.

9. The logical circuit of claim 8, wherein the wired-OR device includes an output having a binary value that is dependent on the variable binary input of the at least one transistor of the digital network.

10. The logical circuit of claim 1, wherein the voltage reducer includes at least one metal-oxide semiconductor (MOS) device.

11. The logical circuit of claim 10, wherein the voltage reducer includes a plurality of MOS devices connected in series.

12. A method for increasing the speed and efficiency of a logic circuit synchronized by a clock having an A and a B phase, the method comprising
providing a wired-OR device that receives a wired-OR voltage during the B phase of the clock;
connecting a virtual ground to the wired-OR device via a digital network; and
during a B phase of the clock, supplying a first power-supply voltage from a first power-supply to the virtual ground via a voltage reducer, wherein the voltage reducer reduces the first power-supply voltage supplied by the first power-supply to the virtual ground to a level less than the first power supply voltage and greater than ground, thereby increasing the speed and efficiency of the logic circuit.

13. The method of claim 12, wherein the first power-supply is connected to the voltage reducer via a first p-channel metal-oxide semiconductor (PMOS) device.

14. The method of claim 13, wherein, in the step of supplying, the first power-supply supplies the first power-supply voltage, $V_{DD}$, to a first source of the first PMOS device.

15. The method of claim 14, wherein, in the step of supplying, the voltage reducer includes at least one MOS device.

16. The method of claim 15, wherein, in the step of supplying, each of the at least one MOS device included in the voltage reducer reduces the first power-supply voltage supplied by the first power-supply to the virtual ground by a threshold voltage.

17. The method of claim 16, wherein the wired-OR device includes a pre-charge device for supplying a wired-OR voltage to the wired-OR device during a B phase of the clock.

18. The method of claim 17, wherein the pre-charge device includes a second PMOS device.

19. The method of claim 18, wherein the pre-charge device includes a second power-supply that supplies a second power-supply voltage to a second source of the second PMOS device.

20. The method of claim 19, wherein the wired-OR voltage and the second power-supply voltage are substantially equal to $V_{DD}$.

21. The method of claim 20, further comprising
setting input values for the digital network during the B phase of the clock, said input values used to evaluate a binary function of the logical circuit.

22. The method of claim 21, further comprising
evaluating the binary function during the A phase of the clock, wherein the wired-OR device includes an output having a binary value that is dependent on the variable binary input of the at least one transistor of the digital network.

* * * * *